(12) United States Patent
McDermott, III et al.

(10) Patent No.: US 9,692,423 B2
(45) Date of Patent: Jun. 27, 2017

(54) SYSTEM AND METHOD FOR CIRCUIT QUANTUM ELECTRODYNAMICS MEASUREMENT

(71) Applicants: Robert Francis McDermott, III, Madison, WI (US); Britton Louis Thomas Plourde, Jamesville, NY (US); Maxim George Vavilov, Middleton, WI (US); Frank Karsten Wilhelm-Mauch, Saarbruecken (DE); Luke Colin Gene Govia, Saarland (DE); Emily Joy Pritchett, Santa Monica, CA (US)

(72) Inventors: Robert Francis McDermott, III, Madison, WI (US); Britton Louis Thomas Plourde, Jamesville, NY (US); Maxim George Vavilov, Middleton, WI (US); Frank Karsten Wilhelm-Mauch, Saarbruecken (DE); Luke Colin Gene Govia, Saarland (DE); Emily Joy Pritchett, Santa Monica, CA (US)

(73) Assignees: Wisconsin Alumni Research Foundation, Madison, WI (US); UNIVERSITAET DES SAARLANDES, Saarbruecken (DE)

(*) Notice: Subject to any disclaimer, the term of this patent is extended or adjusted under 35 U.S.C. 154(b) by 0 days.

(21) Appl. No.: 14/584,659

(22) Filed: Dec. 29, 2014

(65) Prior Publication Data
US 2016/0191060 A1 Jun. 30, 2016

(51) Int. Cl.
*H03K 19/19* (2006.01)
*H03K 19/195* (2006.01)
(Continued)

(52) U.S. Cl.
CPC .......... *H03K 19/1954* (2013.01); *B82Y 10/00* (2013.01); *G06N 99/002* (2013.01);
(Continued)

(58) Field of Classification Search
CPC ... B82Y 10/00; G06N 99/002; Y10S 977/933; H03K 19/1958; H03K 19/195
See application file for complete search history.

(56) References Cited

U.S. PATENT DOCUMENTS 6,897,468 B2 * 5/2005 Blais ..................... B82Y 10/00
257/23
6,900,454 B2 * 5/2005 Blais ..................... B82Y 10/00
257/14

(Continued)

OTHER PUBLICATIONS

Blais, et al., Cavity Quantum Electrodynamics for Superconducting Electrical Circuits: An Architecture for Quantum Computation, Physical Review A, 2004, 69:062320-1 thru 062320-14.
(Continued)

*Primary Examiner* — Vibol Tan
(74) *Attorney, Agent, or Firm* — Quarles & Brady, LLP (57) ABSTRACT

A system for quantum computation and a readout method using the same are provided. In some aspects, the system includes at least one qubit circuit coupled to a resonant cavity, wherein each of the at least one qubit circuit is described by multiple quantum states, and a controller configured to provide microwave irradiation to the resonant cavity such that a quantum state information of the at least one qubit circuit is transferred to a resonant cavity occupation. The system also includes a readout circuit, coupled to the resonant cavity, configured to receive signals corresponding to the resonant cavity occupation, and generate an output indicative of the quantum states of the at least one qubit circuit. Optionally, the system further includes at least one single flux quantum ("SFQ") circuit coupled to the readout circuit and configured to receive the output therefrom.

20 Claims, 5 Drawing Sheets

(51) Int. Cl.
  *B82Y 10/00* (2011.01)
  *G06N 99/00* (2010.01)
(52) U.S. Cl.
  CPC ............ *H03K 19/19* (2013.01); *H03K 19/195*
  (2013.01); *H03K 19/1958* (2013.01)

(56) References Cited

U.S. PATENT DOCUMENTS

| | | | | |
|---|---|---|---|---|
| 6,930,320 | B2* | 8/2005 | Blais | B82Y 10/00 257/14 |
| 7,613,764 | B1* | 11/2009 | Hilton | G06N 99/002 708/801 |
| 7,613,765 | B1* | 11/2009 | Hilton | G06N 99/002 708/801 |
| 7,714,605 | B2* | 5/2010 | Baumgardner | G06N 99/002 326/3 |
| 7,932,514 | B2* | 4/2011 | Farinelli | G06N 99/002 257/30 |
| 7,969,178 | B2* | 6/2011 | Przybysz | G06N 99/002 326/5 |
| 8,022,722 | B1* | 9/2011 | Pesetski | B82Y 10/00 326/3 |
| 8,294,138 | B2* | 10/2012 | Farinelli | B82Y 10/00 257/14 |
| 8,841,764 | B2* | 9/2014 | Poletto | H01L 39/04 257/712 |
| 2004/0077503 | A1* | 4/2004 | Blais | B82Y 10/00 505/190 |
| 2013/0196855 | A1* | 8/2013 | Poletto | H01L 39/04 505/170 |
| 2015/0358022 | A1* | 12/2015 | McDermott, III et al. | H03K 19/1958 326/5 |

OTHER PUBLICATIONS

Chen, et al., Microwave Photon Counter Based on Josephson Junctions, Physical Review Letters, 2011, 107:217401-1 thru 217401-5.
Deblock, et al., Detection of Quantum Noise from an Electrically Driven Two-Level System, Science, 2003, 301:203-206.
Koch, et al., Charge-Insensitive Qubit Design Derived from the Cooper Pair Box, Physical Review A, 2007, 76:042319-1 thru 042319-19.
Likharev, et al., RSFQ Logic/Memory Family: A New Josephson-Junction Technology for Sub-Terahertz-Clock-Frequency Digital Systems, IEEE Transactions on Applied Superconductivity, 1991, 1(1):3-28.
Onac, et al., Shot-Noise Detection in a Carbon Nanotube Quantum Dot, Physical Review Letters, 2006, 96:026803-1 thru 026803-4.
Paik, et al., Observation of High Coherence in Josephson Junction Qubits Measured in a Three-Dimensional Circuit QED Architecture, Physical Review Letters, 2011, 107:240501-1 thru 240501-5.
Rigetti, et al., Superconducting Qubit in a Waveguide Cavity with a Coherence Time Approaching 0.1 ms, Physical Review B, 2012, 86:100506-1 thru 100506-5.
Romero, et al., Microwave Photon Detector in Circuit QED, Physical Review Letters, 2009, 102:173602-1 thru 173602-4.
Schuster, et al., ac Stark Shift and Dephasing of a Superconducting Qubit Strongly Coupled to a Cavity Field, Physical Review Letters, 2005, 94:123602-1 thru 123602-4.
Tucker, et al., Quantum Detection at Millimeter Wavelengths, Rev. Mod. Phys., 1985, 57:1055-1113 [Abstract Only].
Wallraff, et al., Strong Coupling of a Single Photon to a Superconducting Qubit Using Circuit Quantum Electrodynamics, Nature, 2004, 431:162-167.
Wallraff, et al., Approaching Unit Visibility for Control of a Superconducting Qubit with Dispersive Readout, Physical Review Letters, 2005, 95:060501-1 thru 060501-4.

* cited by examiner

SYSTEM AND METHOD FOR CIRCUIT QUANTUM ELECTRODYNAMICS MEASUREMENT

STATEMENT REGARDING FEDERALLY SPONSORED RESEARCH

This invention was made with government support under 1105178 awarded by the National Science Foundation. The government has certain rights in the invention.

BACKGROUND

The field of the disclosure is related to superconducting circuits. More particularly, the disclosure is directed to systems and methods for quantum information processing and quantum computation.

In the field of quantum computation, the performance of quantum bits ("qubits") has advanced rapidly in recent years, with preliminary multi-qubit implementations leading toward surface code architectures. In contrast to classical computational methods that rely on binary data stored in the form of definite on/off states, or bits, methods in quantum computation take advantage of the quantum mechanical nature of quantum systems. Specifically, quantum systems are described using a probabilistic approach, whereby a system includes quantized energy levels whose state may be represented using a superposition of multiple quantum states.

Among the implementations currently being pursued, superconductor-based circuits present good candidates for the construction of qubits given the low dissipation inherent to superconducting materials, which in principle can produce coherence times necessary for performing useful quantum computations. In addition, because complex superconducting circuits can be micro-fabricated using conventional integrated-circuit processing techniques, scaling to a large number of qubits is relatively straightforward. However, scaling up from a few devices to a large-scale multi-qubit circuit presents specific challenges, particularly in the context of quantum measurement, requiring additional resources, infrastructure and complexity.

Superconducting qubits have already achieved several key milestones, including single and coupled qubit state tomography, gate fidelity in excess of 99.9%, and generation of arbitrary quantum states in a superconducting resonator. In particular, circuit Quantum Electrodynamics ("cQED") configurations provide an attractive paradigm for scaling to large numbers of qubits. Here a superconducting qubit plays the role of an artificial atom, and a thin-film coplanar waveguide or bulk cavity resonator is used to realize a bosonic mode with strong coupling to the atom. In the limit where the qubit is far detuned from the cavity resonance, the effective cavity frequency acquires a shift that depends on the qubit state. It is therefore possible to perform quantum non-demolition ("QND") measurement of the qubit by monitoring the microwave transmission across the cavity.

In a conventional cQED measurement, the state of the qubit is encoded in the quadrature amplitudes of a weak microwave signal that is transmitted across the readout cavity. It is possible to access these amplitudes by pre-amplifying the signal using a low-noise linear amplifier followed by heterodyne detection, where the assignment of the detected signal to the qubit $|0\rangle$ or $|1\rangle$ states is performed by subsequent post-processing and thresholding. While this approach may work well for a small number of readout channels, the required superconducting amplifiers, cryogenic semiconducting post-amplifiers, and quadrature mixers entail significant experimental overhead. That is, the amplifiers often require biasing with a strong auxiliary microwave pump tone, which must be isolated from the qubit circuit with bulky cryogenic isolators. Moreover, there is no clear path to integrating the heterodyne detector at low temperature to provide for a more compact, scalable architecture.

Specifically, present systems for measurement and control of superconducting quantum circuits typically include low-temperature systems, such as dilution refrigeration units. Such systems are equipped with frequency generators and single-sideband mixing hardware that generate and transmit electromagnetic signals to multiple superconducting circuits for purposes of measurement and control of the state of each qubit. However, such systems are limited in terms of wiring availability, as well as thermal and noise coupling to room temperature electronics. Hence, in applications involving cryogenic temperatures it is highly desirable to integrate as much of the control and measurement circuitry for a multi-qubit system as possible into the low-temperature environment in order to reduce wiring heat load, latency, power consumption, and the overall system footprint.

Given the above, there is a need for systems and methods amenable to scalable quantum computation with fewer components and reduced overhead, while capable of achieving high performance levels.

SUMMARY

The present disclosure overcomes aforementioned drawbacks by providing a system and method directed to quantum computation using superconducting quantum circuits. Specifically, the present disclosure provides a non-destructive approach for obtaining quantum information associated with quantum circuits, or quantum bits ("qubits"), using a microwave photon counting technique. In particular, a fast, high-fidelity, and scalable measurement scheme is utilized that maps qubit state information via a resonant cavity to an output of a readout Josephson photomultiplier detector, without need for room-temperature detection. As will be appreciated, the current approach affords cryogenic interfacing with other superconducting digital control circuitry for use in quantum computation.

In one aspect of the present disclosure, a system for quantum computation is provided. The system includes at least one qubit circuit coupled to a resonant cavity, wherein each of the at least one qubit circuit is described by addressable quantum states, and a controller, coupled to the resonant cavity, configured to provide microwave irradiation to the resonant cavity such that a quantum state information of the at least one qubit circuit is transferred to a resonant cavity occupation. The system also includes a readout circuit, coupled to the resonant cavity, configured to receive signals corresponding to the resonant cavity occupation, and generate an output indicative of the quantum states of the at least one qubit circuit. Optionally, the system further includes at least one single flux quantum ("SFQ") circuit coupled to the readout circuit and configured to receive the output therefrom.

In another aspect of the present disclosure, a readout method for use in quantum computation is provided. The method includes applying an excitation to a resonant cavity coupled to at least one qubit circuit to achieve a resonant cavity occupation, wherein a frequency of the excitation corresponds to one of a plurality of quantum states of the at least one qubit circuit. The method also includes mapping the resonant cavity occupation to a voltage state of a readout circuit coupled to the resonant cavity to generate an output indicative of the quantum states of the at least one qubit circuit. Optionally, the method further includes restoring the resonant cavity to a near-vacuum state by applying a coherent pulse to depopulate the resonant cavity.

The foregoing and other aspects and advantages of the invention will appear from the following description. In the description, reference is made to the accompanying drawings which form a part hereof, and in which there is shown by way of illustration a preferred embodiment of the invention. Such embodiment does not necessarily represent the full scope of the invention, however, and reference is made therefore to the claims and herein for interpreting the scope of the invention.

DETAILED DESCRIPTION

In the quantum computing space, superconducting quantum bit, or "qubit," performance has advanced rapidly in recent years, with initial multi-qubit implementations leading towards surface code architectures. However, a truly scalable computational system requires the ability to perform rapid high fidelity measurement of qubits while minimizing the required (often expensive) resources. Hence, unlike prior approaches that rely upon signal amplification and post-processing and include significant resource overhead, the present disclosure provides a system and method for use in quantum computation that implement a readout of qubit states by mapping them onto a resonant cavity occupation, measurable using a photon counting technique. This includes preparation of "bright" and "dark" cavity pointer states using a coherent drive pulse with a duration advantageously matched to the inverse detuning of the so-called dressed cavity frequencies describing the qubit-cavity system.

As will be described, the present approach provides for an efficient, scalable approach that is amenable to further use and/or processing. In particular, the readout circuit described, which includes a Josephson photomultiplier ("JPM") circuit, utilizes relatively low-bandwidth dc wiring and without need for separate microwave bias tone, making it more compact. Also the JPM circuit provides a natural interface to classical Josephson digital logic based on propagating fluxons, such as Single Flux Quantum ("SFQ") logic circuits, which helps mitigate the need for expensive (in terms of heat load and system footprint) connections between the measurement cryostat and room-temperature control electronics. In addition, JPM circuits are ideally suited to the measurement of multi-qubit parity operators, a key element in error detection schemes for scalable topological surface codes.

Conventional circuit quantum electrodynamics ("cQED") measurement methods rely on the state of a qubit being encoded in the quadrature amplitudes of a weak microwave signal that is transmitted across a readout cavity. In this approach, amplification is required, along with the use of a heterodyne detection technique that includes non-linear mixing of received and referenced signals. Assignment of the detected signal to the different qubit states is performed by subsequent post-processing and thresholding. While this approach is amenable to a small number of readout channels, the required superconducting amplifiers, low-noise HEMT amplifiers, and quadrature mixers entail significant experimental overhead for a large-scale system. Also, there is no clear path to integrating existing heterodyne detectors at low temperature to provide for a more compact, scalable architecture.

In contrast to traditional amplifiers, the present disclosure recognizes that a photon counter can be utilized to perform qubit readout in a non-destructive fashion. In particular, a photon counter responds to the total power of the input, where the presence or absence of photons projects the counter into one of two possible classical output states, irrespective of the phase of the input signal. In accordance with aspects of the present disclosure, a photon counter can include a Josephson junction detector current-biased such that the energy separation between the ground and first excited states in the metastable minima of the junction potential energy landscape is resonant with the energy of the incident microwaves. Absorption of a single microwave photon can then promote the junction to the excited state, which tunnels rapidly to the continuum, producing a large and easily measured voltage of order twice the superconducting gap voltage. Practical counters often absorb only a fraction of the impinging photons while maintaining the required intensity threshold behavior. Such a detector, herein referred to as a Josephson photomultiplier ("JPM") circuit, provides an intrinsically broadband frequency response, with an achievable single-shot measurement fidelity around 99%. Notably, a JPM is only one example of a photon counter that can be used for this purpose.

As will be detailed, in the present disclosure, measurement of one or more qubits for use in quantum computation includes a drive stage, where each qubit state is mapped to a microwave photon occupation of a readout cavity. This is performed by exciting the resonant cavity coupled to the qubit at a frequency that corresponds to a state of the qubit to achieve a resonant cavity occupation. In particular, a microwave pulse applied at the so-called dressed frequency corresponding to, say, a qubit state 1 creates a "bright" cavity if the qubit is in the excited state. If the qubit is in the ground state, the cavity acquires a non-negligible occupation at the start of the pulse, but coherently oscillates back to the "dark" vacuum state upon completion of the drive pulse. During this drive stage, the JPM circuit idles at a frequency that is detuned from the cavity, for instance, detuned by around 1 GHz. Then, in the measurement stage, the resonant cavity occupation is mapped to a voltage state of the JPM circuit set to a suitable threshold, which generates an output indicative of the qubit state. This is achieved by rapidly tuning the JPM circuit into resonance with the cavity, whereby a bright cavity induces a transition to the voltage state, while a dark cavity leaves the JPM circuit in the supercurrent state. In some aspects, an evacuation stage is performed, whereby the cavity may be coherently depopulated by applying a coherent pulse to return the cavity to a near-vacuum state. This stage avoids the need for the cavity to decay via spontaneous emission.

As will be appreciated, in the present approach it is therefore possible to perform quantum non-demolition ("QND") measurement of a qubit by first mapping qubit state information to the photon occupation of a resonant cavity followed by photodetection of the cavity state with a JPM. In addition, it is possible to read out multiple qubits with a single measurement resonator. Moreover, multiple resonators can be integrated on a common feedline and coupled to a single measurement channel to facilitate wiring and control of complex many-qubit circuits.

Figure 1:
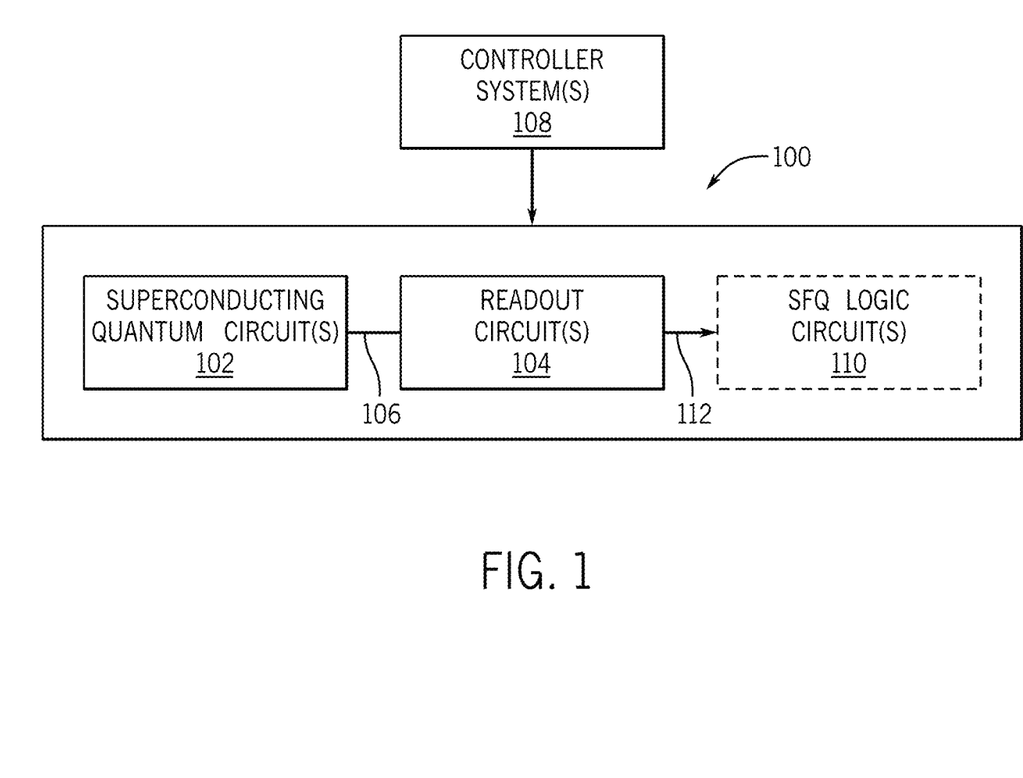
FIG. 1 is a schematic of an example system for use in quantum computation in accordance with the present disclosure.

Turning to FIG. 1, an example system 100 for use in quantum information processing or quantum computation, in accordance with the present disclosure, is shown. The system 100 includes superconducting quantum circuit(s) 102 coupled to one or more readout circuit(s) 104, and is controllable using one or more controller system(s) 108, as generally indicated in FIG. 1. In some configurations, system 100 also includes single flux quantum ("SFQ") logic circuit(s) 110 coupled to the readout circuit(s) 104 via one or more couplings 110. In addition, system 100 may be configured to operate over a broad range of temperatures, including temperatures consistent with a superconducting state for materials configured therein.

The superconducting quantum circuit(s) 102 may include any number of linear and non-linear circuit elements, including Josephson junctions, inductors, capacitors, resistors, and so on. In accordance with aspects of the present disclosure, the superconducting quantum circuit(s) 102 include single or multiple superconducting qubit circuits, or qubits, coupled to one or more resonant cavities (not shown in FIG. 1). Example qubit circuits include transmon qubits. In some configurations, resonant cavities may be formed in part by superconducting transmission lines.

Readout circuits(s) 104 may be coupled to the superconducting quantum circuit(s) 102 via one or more couplings 106, and configured to receive and respond to signals corresponding to prepared resonant cavity occupations, generating an output indicative of the quantum states of at least one qubit circuit. In accordance with aspects of the present disclosure, the readout circuit(s) can include one or more Josephson photomultiplier ("JPM") circuits, or detectors, as will be described.

Controller system(s) 108 can include various electronic systems, hardware or circuitry components in communication with system 100 and capable of a wide range of functionality. In some implementations, controller system(s) 108 can include at least one microwave source configured to provide microwave irradiation to resonant cavities via transmission lines. In some aspects, the provided microwave irradiation may be configured such that quantum state information of the at least one qubit circuit is transferred to a resonant cavity occupation. As described, such resonant cavity occupation can include bright and dark cavity pointer states.

In some configurations, controller system(s) 108 can include one or more voltage or current sources, for use in controlling a Josephson junction configured in the readout circuit(s) 104. For instance, controller system(s) 108 may be used to bias a Josephson junction in a JPM circuit below a critical current. Specifically, in some conditions, the controller system(s) 108 may be used to detune the readout circuit(s) 104 away from a measurement frequency such that an effective interaction between resonant cavities and readout circuit(s) 104 is dispersive during a drive stage. In other conditions, controller system(s) 108 may also be used to map a resonant cavity occupation to a voltage state of a readout circuit coupled to the resonant cavity, generating an output signal indicative of the quantum state of the qubit during a readout or measurement stage. In particular, mapping such resonant cavity occupation can include applying a bias pulse that tunes the readout circuit into resonance with a resonant cavity. As described, the output can include a binary digital signal indicative of a voltage or superconducting state of a Josephson junction included in the readout circuit(s) 104, which may be acquired by the controller system(s) 108 or relayed for further processing.

In some configurations, system 100 can further include SFQ logic circuit(s) 110 coupled to the readout circuit(s) 104 via one or more couplings 112, the SFQ logic circuits(s) 110 configured to receive the output from the readout circuit(s) 104. SFQ logic circuit(s) 110 may include any number of SFQ modules, along with other logically connectable circuits or components, arranged in any manner. In some configurations, the SFQ logic circuit(s) 110 and readout circuit(s) 104 may be coupled using a Josephson transmission line ("JTL").

The one or more couplings 112 providing a communication between the readout circuit(s) 104 and SFQ logic circuit(s) 110 may configured to transmit, modulate, amplify, or filter, the output generated from the readout circuit(s) 104. The one or more couplings 112 can include any circuitry elements, including capacitive or inductive elements, passive transmission lines, active Josephson transmission lines, including any number of Josephson junctions, and so forth. In some aspects, the one or more coupling 112 may also include a normal metal resistor, facilitating independent control of the readout circuit(s) 104 and SFQ logic circuit(s) 110. In addition, the controller system(s) 108 may further provide signals for modulating or tuning the one or more couplings 112, along with controlling or acquiring signals from the SFQ logic circuit(s) 110.

Figure 2A:
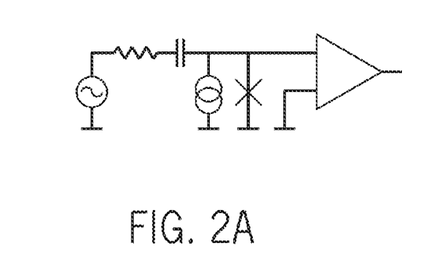
FIG. 2A is a schematic diagram of an example Josephson-junction microwave detector.
Figure 2B:
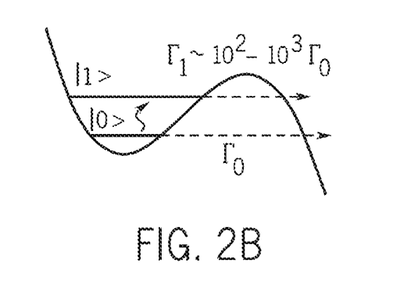
FIG. 2B is the potential energy landscape for the junction of FIG. 2A.

A schematic diagram of a JPM-based detector for photon counting, in accordance with aspects of the present disclosure, is shown in FIG. 2A. In contrast to previous detectors which rely on the tunneling of quasiparticles in a voltage-biased junction, the junction shown in FIG. 2A may be biased in the supercurrent state with a current $I_b$ that is slightly below the junction critical current $I_0$. The potential energy landscape $U(\delta)$ for the phase difference $\delta$ across the junction takes on the tilted-washboard form, as shown in FIG. 2B, with local potential minima characterized by a barrier height $\Delta U$ and plasma frequency $\omega_p$. In some aspects, the circuit design and bias parameters may be chosen so that there are two discrete energy levels in each local minimum of the potential, $\Delta U/\hbar\omega_p \sim 2$, with the junction initially occupying the ground state. Microwaves tuned to the junction resonance then induce a transition to the first excited state, which rapidly tunnels to the continuum, as shown in FIG. 2B. This tunneling transition in turn leads to the appearance of a large voltage across the junction of order twice the superconducting gap. Absorption of a photon thus yields an unambiguous and easily measured "click" signal. In some aspects, the bias point of the junction may be pulsed for a finite interval, for example, on the order 10 ns, so that the transition frequency between the junction ground and first excited states is close to the frequency of the incident photons. At this point, the junction is in the "active" state, and there is high probability that absorption of a photon will induce a transition to the continuum.

Figure 2C:
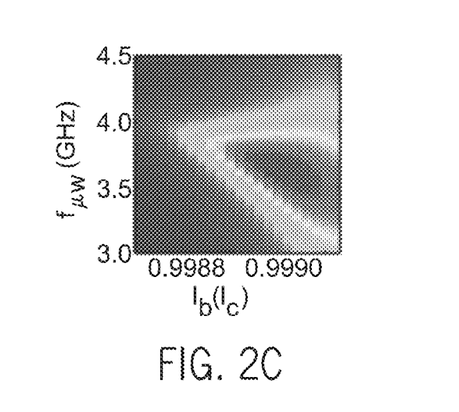
FIG. 2C-D are graphical examples calculated and measured, respectively, detection efficiencies as a function of applied microwave frequency and current bias for the Josephson-junction microwave detector of FIG. 2A.
Figure 2D:
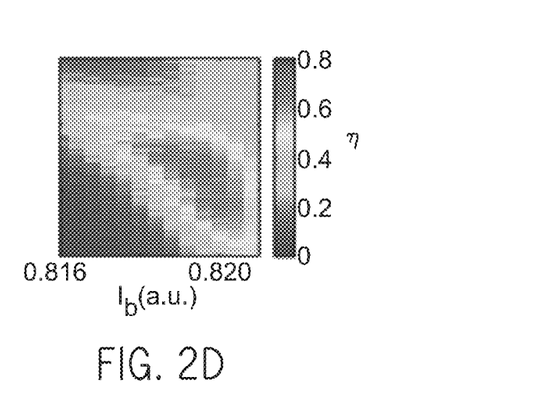

The efficiency η of such detection was analyzed both theoretically, as shown in the example of FIG. 2C, and verified experimentally, as shown in the example of FIG. 2D. It was found that η peaks for a measurement interval that is roughly equal to the Rabi period of the coherent drive. That is, for very short times, the interaction with the drive field is too weak to induce a transition, while for longer measurement times dark counts due to quantum tunneling from the ground state degrade performance. Finally, η is peaked for a frequency that is tuned to the energy spacing between the JPM ground and first excited states, with a (typically large) detection bandwidth of order the Rabi frequency. It may be noted that for Rabi frequencies of order 100 MHz, comparable to vacuum Rabi frequencies achieved in cQED experiments, detection bandwidths of order several hundred MHz and efficiencies around 90% were attained for junctions with extremely modest coherence times of order 1 ns. Thus, high-fidelity microwave photon counting is possible with standard circuits incorporating Al—AlOx-Al junctions and plasma-enhanced chemical vapor deposited (PECVD) dielectrics that would not necessarily be suitable for qubit work.

In previous work by the inventors, a two-junction version of the JPM was used to perform a microwave photon counting version of the classic Hanbury Brown and Twiss experiment. By analyzing the joint switching probabilities of the two junctions, the second-order quantum coherence of the photon field $g^{(2)}(\tau)$ was accessed, where τ is the relative delay between the two measurements. With this photon counting setup the Poisson statistics of a coherent source and signatures of microwave photon bunching in the case of a thermal source were clearly resolved. These earlier experiments demonstrate the viability of using two junctions to probe a single microwave source. As described below, the possibility of relying on "majority vote" of multiple JPMs coupled to the same readout tone provides a path to reducing qubit measurement infidelity by at least an order of magnitude.

Figure 3:
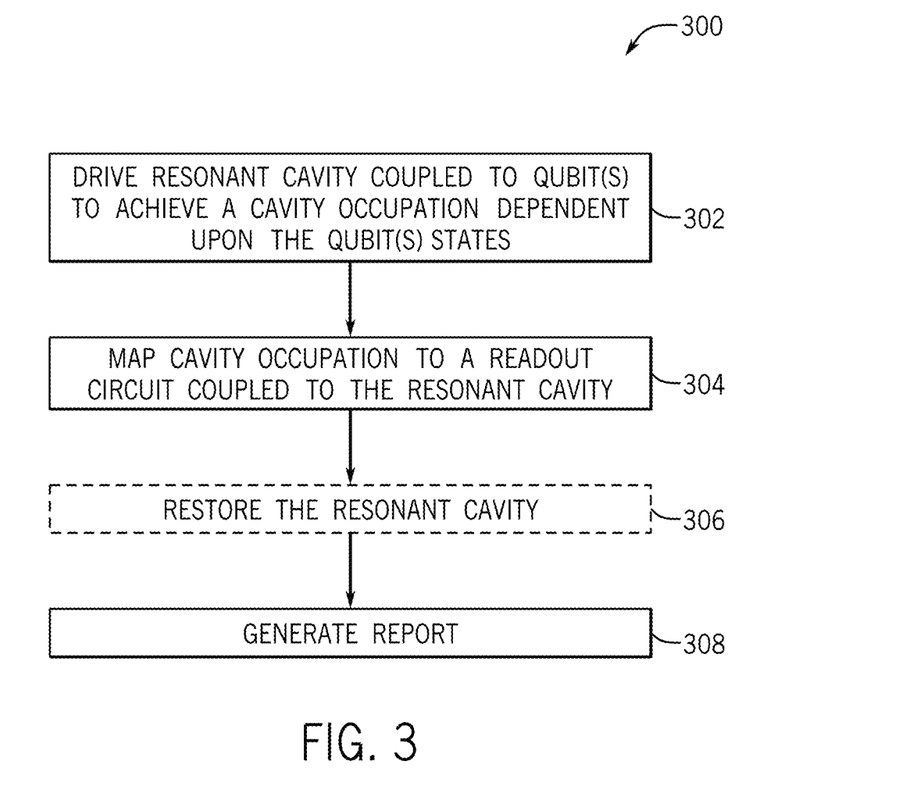
FIG. 3 is a flowchart setting forth steps of one example of a process for controlling superconducting quantum circuits in accordance with the present disclosure.

Referring now to FIG. 3, a flowchart is shown setting forth steps of an example process 300 for readout method for use in a quantum computation, in accordance with the present disclosure, and as further detailed in the publication by the inventors (Govia et al., "High-fidelity qubit measurement with a microwave-photon counter," Phys. Rev. A 90, 062307 2014), which is included herein in its entirety.

The process may begin at process block 302 whereby the quantum states of one or more qubit circuit(s) are mapped to photon occupations of one or more readout cavities coupled to the qubit circuit(s). This "loading," or driving stage, drives the resonant cavities, for instance using one excitation source, to achieve cavity occupations that depends upon the quantum states of the qubit circuit(s).

Figure 4A:
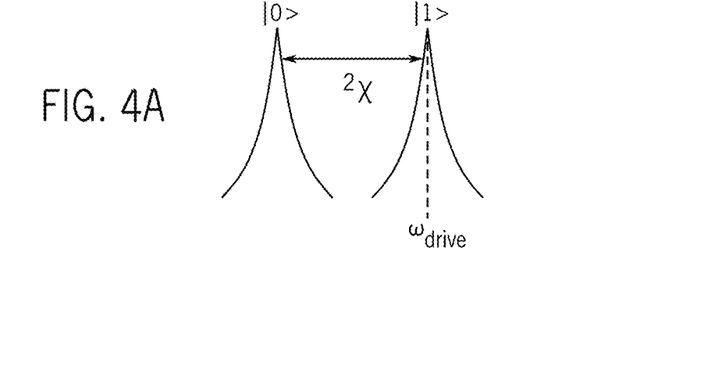
FIG. 4A-4C is a schematic diagram showing a high-fidelity qubit measurement using a Josephson photomultipler ("JPM") circuit detector, in accordance with aspects of the present disclosure.
Figure 4B:
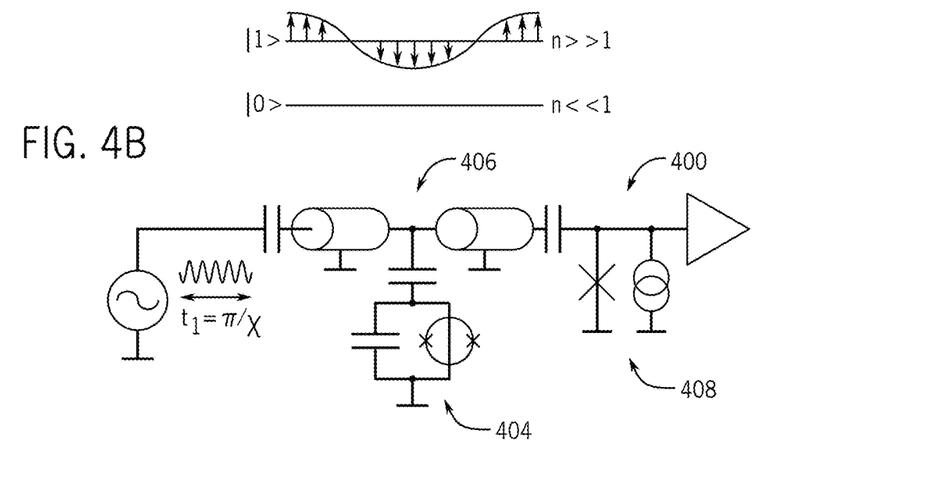

By way of example, FIG. 4 shows a diagram of an example qubit readout circuit 400 and measurement protocol 402, using a JPM-based detector, in accordance with aspects of the present disclosure. In particular, as shown in FIG. 4B, a qubit 404 (resonating, for example, around 5 GHz) is coupled to a readout cavity 406 (resonating, for example, around 6 GHz), and a JPM-based detector 408. In some aspects, the qubit readout circuit 400 may be designed so that the readout cavity 406 has a transmission maximum when it is driven on resonance. In the dispersive limit of the Jaynes-Cummings Hamiltonian, the readout cavity 406 acquires a dispersive shift $\chi \equiv g^2/\Delta$ that depends on the state of the qubit 404. For the purposes of realizing a fast measurement, it may be more desirable to have a relatively large dispersive shift, for instance, on the order of 10 MHz, as opposed to the smaller dispersive shifts of say 1 MHz, as realized in typical cQED experiments. These larger shifts will require vacuum Rabi coupling of order 100 MHz, which is well within the capabilities of current fabrication techniques.

Figure 4C:
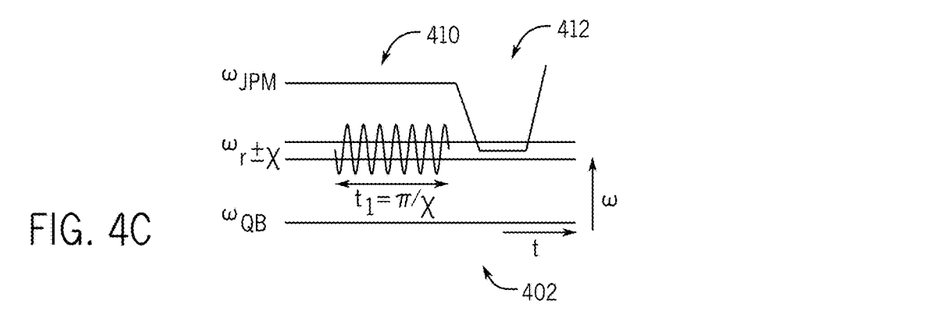
Figure 5A:
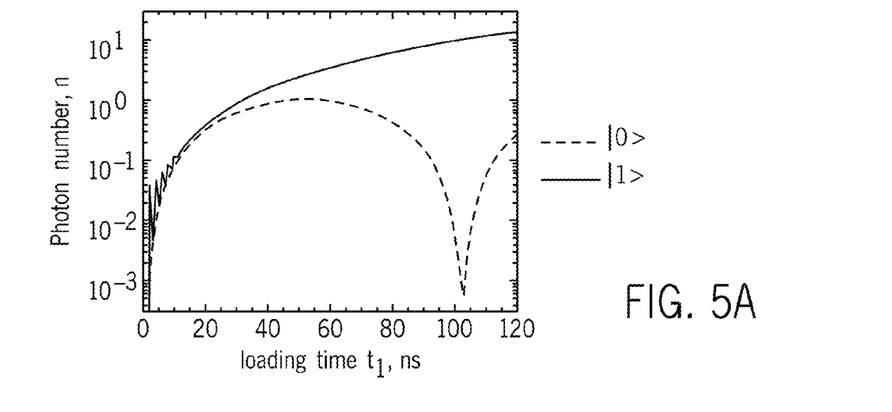
FIG. 5A is a plot of simulated cavity occupation versus time during coherent drive for a qubit in ground and excited states.

At process block 302, the JPM-based detector 408 is biased above the readout cavity resonance, for example around 6.5 GHz, while the readout cavity 406 is driven at the dressed frequency corresponding to qubit occupation of the excited state $|1\rangle$, illustrated in the driving stage 410 of FIG. 4C. The goal is to populate the readout cavity 406 with a large number of photons compatible with the dispersive description of circuit QED in the event that the qubit is in state $|1\rangle$, while inducing minimal cavity occupation in the event that the qubit 404 is in state $|0\rangle$. For an arbitrary cavity drive time, a non-negligible cavity occupation may be produced even if the qubit 404 is in state $|0\rangle$, due to off-resonant population of the readout cavity 406 by the strong coherent drive. However, if the readout cavity 406 is irradiated for a time $t_1 = \pi/\chi$ equal to the inverse of the detuning of the two possible dressed frequencies of the readout cavity 406, the readout cavity 406 occupation can coherently oscillate back to zero upon completion of the drive pulse in the event that the qubit is in the $|0\rangle$ state. Numerical simulations indicate that this protocol leads to a difference of more than four orders of magnitude in the mean occupation of a high-quality cavity for the two possible qubit states (as shown in FIG. 5A). Thus the state of the qubit 404 can be successfully mapped to photon occupation of the readout cavity 406 with extremely high fidelity of 99.99%. A few orders of magnitude difference in the mean occupation can also be achieved for cavities with lower quality factor by using a more complex series of microwave pulses to create the cavity pointer states. For this reason, the contribution of the drive stage 410 of the measurement protocol 402 to the overall measurement infidelity is negligible.

Referring again to FIG. 3, at process block 304 the photon occupation of one or more readout cavities are mapped to the state of at least one readout circuit. That is, at this step, the photon occupation is mapped to classical output signals, for instance, in the form of "click" or "no click" signals, associated with a voltage state or superconducting state of the readout circuit(s), which can be passed on to subsequent stages of classical measurement and control circuitry. Specifically, the generated output is indicative of quantum states of one or more qubit circuit(s) coupled to the one or more readout cavities.

Figure 5B:
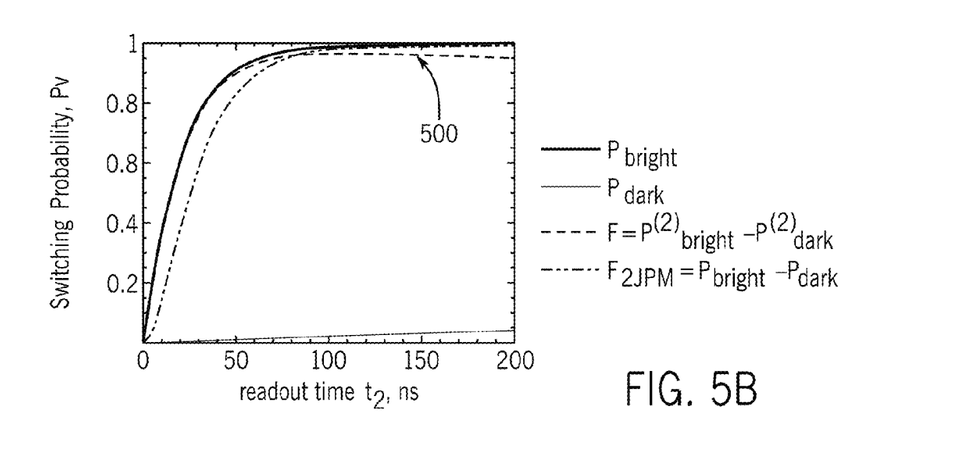
FIG. 5B is a graphical example of simulated switching probability of a JPM versus readout time.
Figure 5C:
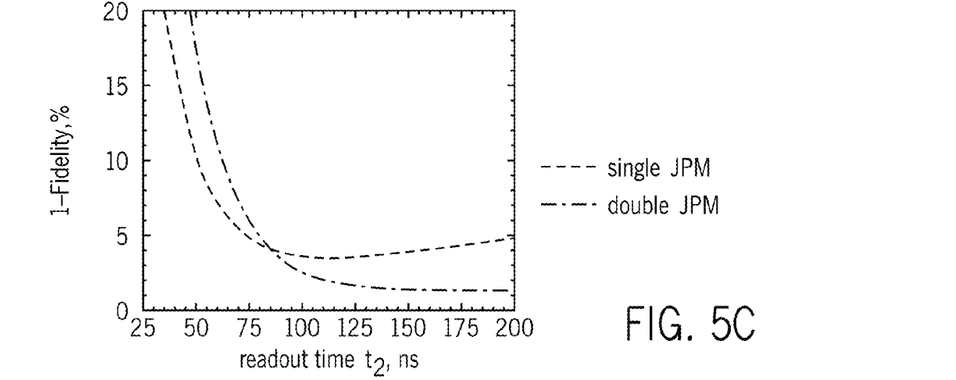
FIG. 5C is a graphical example of readout infidelity for single and double JPMs versus readout time.

An example of the readout stage 412 of the measurement protocol 402 is again shown in FIG. 4C. As described, a fast bias pulse may be desirable that tunes the JPM-based detector 408 into resonance with the readout cavity 406, allowing the cavity to interact coherently with the JPM-based detector 408 for a time $t_2$. Provided that the readout cavity 406 is populated with a finite number of photons, the JPM-based detector 408 will be promoted from its ground state to the first excited state, which will tunnel rapidly to the continuum. For realistic parameters of low-Q JPMs, a fidelity greater than about 99.9% for correctly identifying the cavity bright state in a measurement time of order 100 ns is found. Of note is that a short JPM $T_1$ of order 5 ns would not limit measurement fidelity if the mean photon number in the cavity bright state is high, which is part of our measurement strategy: there are plenty of additional photons on hand to induce a switch to the voltage state and only $t_2/T_1$ photons are lost during readout. In fact, numerical simulations indicate that the dominant infidelity of the measurement comes from misidentification of the dark cavity due to quantum tunneling of the JPM-based detector 408 from its ground state, as shown in FIG. 5B. Moreover, short pure dephasing can actually be advantageous for the measurement. The contribution of dark counts can be reduced by utilizing two JPMs, as illustrated in the graph of FIG. 5C and discussed below.

Referring again to FIG. 3, at process block 306, at last one resonant cavity may be optionally restored to a near-vacuum state by applying a coherent pulse to depopulate the resonant cavity, followed by a report being generated at process block 308, indicative of the states of the measured qubit circuit(s). In some aspects, the output generated may not only be provided in the form of reported quantum states or signals measured, but may be further relayed to other circuits, or systems for further processing. As described, such output may be provided to SFQ logic circuit(s) coupled to the readout circuit(s).

Some non-limiting examples of a few specific advantages of this measurement protocol provided by the present disclosure are as follows.

The JPM-based detector itself acts as a compact, easy-to-realize and scalable Purcell filter. When the junction is biased in the supercurrent state, the non-linear Josephson inductance and the linear self-capacitance of the tunnel junction form a plasma resonance at a frequency of about 6.5 GHz corresponding to the "idle" state of the junction. The junction plasma resonance acts as a high-Q bandpass filter, isolating the qubit from broadband noise generated by the readout and control circuitry that might induce qubit relaxation. Semi-classical circuit simulations evidence that the presence of the JPM suppresses the real part of the admittance at the qubit transition frequency by more than three orders of magnitude. The added isolation afforded by this "built in" Purcell filter allows the use of strong coupling at the output port of the measurement cavity with little or no degradation of qubit $T_1$, facilitating fast measurement.

The output of the junction is a voltage pulse of order the superconducting gap voltage ($2\Delta/e \approx 380$ μV for the case of an Al-based junction). These pulses interface naturally with cold control circuitry based on Single Flux Quantum (SFQ) digital logic, in which logical bits are represented in terms of voltage pulses whose temporal profile is quantized in units of the flux quantum $\Phi_0 \equiv h/2e \approx 2.07 \times 10^{-15}$ Tm$^2$. By contrast, the need for homodyne or heterodyne detection, such as in the case of qubit measurement approaches that utilize linear amplifiers, poses a technical challenge, if the goal is to implement qubit measurement circuitry within the low-temperature cryostat.

Due to the extremely high fidelity with which a qubit state can be mapped to a readout cavity occupation, measurement infidelity is dominated by misidentification of the cavity dark state due to quantum tunneling of the JPM-based detector from its ground state to the continuum. The infidelity can be suppressed by an order of magnitude by reading out the single measurement cavity using two junctions instead of one and relying on "majority vote" to determine the qubit state. In fact, a very-attractive exponential scaling of measurement infidelity is found with the measurement resources. For a readout cavity with a single JPM-based detector, a fidelity greater than about 90% can be achieved, while for a readout cavity with two JPM-based detectors, a fidelity of about 99% is expected. A detailed discussion is provided below regarding the fidelity of a JPM-based detector measurement, in accordance with aspects of the present disclosure.

Microwave Counting: Qubit Measurement Fidelity

Specifically, a measurement fidelity $\Im$ may be defined in the following manner:

$\Im = 1 - $(prob. of misident. of qubit $|1\rangle$)$-$(prob. of misident. of qubit $|0\rangle$).

We define $P_{bright}$ as the probability that the JPM-based detector switches to the voltage state in the case where the coherent drive step of the measurement has prepared the cavity in the bright state, and $P_{dark}$ as the probability that the JPM switches in the case where the cavity remains in the vacuum state. In this case, $\Im = P_{bright} - P_{dark}$.

A calculation of $P_{bright}$ and $P_{dark}$ as a function of interaction time during the readout interval can be performed, as shown in the example of FIG. 5B. These plots are analogous to the S-curves obtained in the case of heterodyne measurement by integrating histograms of the measured quadrature voltages obtained following preparation of the two possible qubit states. It is seen that $P_{bright}$ saturates very close to one at an interaction time around 100 ns, while $P_{dark}$ increases roughly linearly with time due to the finite quantum tunneling rate from the JPM ground state. The measurement fidelity $\Im$ shown in the trace peaks 500 around 95%, with the dominant contribution to measurement infidelity coming from JPM dark counts. As shown, the dark state fidelity can be increased by using two junctions to measure the same readout resonator. Because spurious dark events in the two junctions are uncorrelated, the probability that both junctions will register a click when the cavity is in the dark state is reduced from $P_{dark}$ to $P_{dark}^{(2)} = (P_{dark})^2$, the joint probability that both junctions switch, while the joint probability of both junctions switching in the bright state remains close to one. Thus, we find that the measurement fidelity improves to $\Im = P_{bright}^{(2)} - P_{dark}^{(2)}$. The addition of the second junction and the use of a simple majority vote to reject spurious dark counts takes the measurement fidelity to around 99% for a 100-ns interaction time. At this level, the fidelity of JPM measurement is comparable to that achieved using quantum limited amplifiers, and is suitable for the realization of scalable surface codes.

Microwave Counting as a Scalable Qubit Measurement Paradigm

Numerical simulations establish that microwave counting is a viable approach to qubit measurement, with the ability to yield fidelity that equals or even surpasses fidelities achieved with quantum-limited linear amplifiers. From the standpoint of scalability, the JPM offers a variety of practical advantages. Some non-limiting examples include simple DC biasing with low-bandwidth lines, straight-forward fabrication with a longer-term prospect of integrating the JPM on the qubit chip, a natural interface to cold SFQ-based control circuitry, and a natural fit with the multi-qubit parity measurements required for error correction in the surface code. Thus, microwave photon counting as an alternative to heterodyne measurement with linear amplifiers is attractive.

Thus, the present disclosure provides systems and methods for robust, scalable, near-quantum limited measurement tools for high-fidelity readout in large-scale multi-qubit circuits.

The present invention has been described in terms of one or more preferred embodiments, and it should be appreciated that many equivalents, alternatives, variations, and modifications, aside from those expressly stated, are possible and within the scope of the invention.

What is claimed is:

1. A system for quantum computation comprising:
   at least one qubit circuit coupled to a resonant readout cavity, wherein each of the at least one qubit circuit is described by multiple quantum states;
   a controller configured to provide microwave irradiation to the resonant readout cavity such that a quantum state information of the at least one qubit circuit is transferred to a resonant cavity occupation; and
   a readout circuit, coupled to the resonant readout cavity, configured to receive signals corresponding to the resonant cavity occupation, and generate an output indicative of the quantum states of the at least one qubit circuit.

2. The system of claim 1, wherein the at least one qubit circuit comprises a transmon qubit.

3. The system of claim 1, wherein the resonant cavity occupation achieved using the controller comprises a bright cavity pointer state or a dark cavity pointer state.

4. The system of claim 1, wherein the readout circuit comprises a Josephson photomultiplier ("JPM") circuit.

5. The system of claim 1, wherein the output includes a binary signal.

6. The system of claim 1, wherein the system further comprises at least one single flux quantum ("SFQ") logic circuit coupled to the readout circuit and configured to receive the output therefrom.

7. The system of claim 6, wherein the at least one SFQ logic circuit and the readout circuit are coupled using a Josephson transmission line ("JTL").

8. The system of claim 1, wherein the readout circuit is coupled to a Josephson transmission line ("JTL") using a normal metal resistor.

9. The system of claim 1, wherein the readout circuit is detuned away from a measurement frequency such that an effective interaction between the resonant readout cavity and the readout circuit is dispersive during a drive stage.

10. A readout method for use in quantum computation, the method comprising:
    i) applying an excitation to a resonant readout cavity coupled to at least one qubit circuit to achieve a resonant cavity occupation, wherein a frequency of the excitation corresponds to one of a plurality of quantum states of the at least one qubit circuit; and
    ii) mapping the resonant cavity occupation to a voltage state of a readout circuit coupled to the resonant readout cavity to generate an output indicative of the quantum states of the at least one qubit circuit.

11. The method of claim 10, wherein the excitation applied at step i) includes microwave irradiation applied for a duration related to a frequency spacing between dressed states of the resonant readout cavity corresponding to the quantum states of the at least one qubit circuit.

12. The method of claim 10, wherein at step i) a quantum state information of the at least one qubit circuit is transferred to the resonant cavity occupation.

13. The method of claim 10, wherein the resonant cavity occupation comprises a bright cavity pointer state or a dark cavity pointer state.

14. The method of claim 10, wherein the readout circuit includes a Josephson photomultiplier ("JPM") circuit.

15. The method of claim 14, the method further comprising biasing a Josephson junction in the JPM circuit below a critical current.

16. The method of claim 10, wherein at step i) the readout circuit is detuned away from a measurement frequency such that an effective interaction between the resonant readout cavity and the readout circuit is dispersive.

17. The method of claim 10, wherein mapping the resonant cavity occupation at step ii) comprises applying a bias pulse that tunes the readout circuit into resonance with the resonant readout cavity.

18. The method of claim 10, wherein the output comprises a binary signal.

19. The method of claim 10, the method further comprising providing the output to at least one single flux quantum ("SFQ") logic circuit coupled to the readout circuit.

20. The method of claim 10, the method further comprising restoring the resonant readout cavity to a near-vacuum state by applying a coherent pulse to depopulate the resonant readout cavity.

* * * * *